United States Patent
Chang (10) Patent No.: US 9,380,735 B2
(45) Date of Patent: Jun. 28, 2016

(54) CONTAINER DATA CENTER AND HEAT DISSIPATION SYSTEM

(71) Applicant: HON HAI PRECISION INDUSTRY CO., LTD., New Taipei (TW)

(72) Inventor: Chih-Hung Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 223 days.

(21) Appl. No.: 14/141,451

(22) Filed: Dec. 27, 2013

(65) Prior Publication Data

US 2015/0156925 A1   Jun. 4, 2015

(30) Foreign Application Priority Data

Nov. 30, 2013  (CN) .......................... 2013 1 06228017

(51) Int. Cl.
- *H05K 7/20* (2006.01)
- *G06F 1/20* (2006.01)
- *H05K 7/14* (2006.01)

(52) U.S. Cl.
CPC .......... *H05K 7/20836* (2013.01); *H05K 7/1497* (2013.01); *H05K 7/20145* (2013.01); *H05K 7/20745* (2013.01); *F24F 2221/40* (2013.01)

(58) Field of Classification Search
CPC ............ H05K 7/1497; H05K 7/20745; H05K 7/20836; F24F 2221/40
See application file for complete search history.

(56) References Cited

U.S. PATENT DOCUMENTS

| | | | | |
|---|---|---|---|---|
| 6,574,104 B2 * | 6/2003 | Patel | .................. | H05K 7/20745 165/104.33 |
| 6,694,759 B1 * | 2/2004 | Bash | .................... | G05D 16/202 236/49.3 |
| 6,747,872 B1 * | 6/2004 | Patel | ......................... | G06F 1/20 165/104.33 |
| 6,868,682 B2 * | 3/2005 | Sharma | .................... | G01K 7/42 361/696 |
| 6,957,544 B2 * | 10/2005 | Dobbs | .................... | F24F 11/053 165/80.3 |
| 6,981,915 B2 * | 1/2006 | Moore | .................. | F24F 11/053 137/553 |
| 7,251,547 B2 * | 7/2007 | Bash | .................. | G05D 23/1934 62/186 |
| 7,347,058 B2 * | 3/2008 | Malone | ................... | F24F 13/12 236/49.3 |
| 7,656,660 B2 * | 2/2010 | Hoeft | ................. | H05K 7/20745 181/200 |

(Continued)

*Primary Examiner* — Robert J Hoffberg
(74) *Attorney, Agent, or Firm* — ScienBiziP, P.C.

(57) ABSTRACT

A heat dissipation system for cabinet servers supported on a raised floor includes a condenser, airflow adjusting apparatus, a controller, and a temperature sensor located at an air outlet of each cabinet server. The raised floor defines air outlets adjacent to each cabinet server. The adjusting apparatus are mounted to the raised floor and aligning with the air outlets. Each of the airflow adjusting apparatus includes a number of shielding members rotatable relative to the raised floor and aligning with the air outlets, and a motor electrically coupled to the controller. The temperature sensors are electrically coupled to the controller. The condenser generates cool air entering the raised floor through the air inlet, to enter the cabinet servers through the airflow adjusting apparatus and the air outlets. The controller controls the shielding members to rotate, to change the opening size of the air outlets of the raised floor.

13 Claims, 6 Drawing Sheets

(56) References Cited

U.S. PATENT DOCUMENTS

| | | | | |
|---|---|---|---|---|
| 7,667,965 B2* | 2/2010 | Nobile | H05K 7/20745 | 181/202 |
| 7,682,234 B1* | 3/2010 | Beitelmal | F24F 11/0001 | 361/695 |
| 8,037,644 B2* | 10/2011 | Hall | H05K 7/20745 | 52/1 |
| 8,327,598 B2* | 12/2012 | Shew | H05K 7/1401 | 16/225 |
| 8,596,079 B2* | 12/2013 | Beam | F24F 11/0012 | 165/205 |
| 8,626,346 B2* | 1/2014 | Archibald | H05K 7/20745 | 700/278 |
| 8,639,651 B2* | 1/2014 | Beitelmal | H05K 7/20836 | 706/62 |
| 8,640,479 B2* | 2/2014 | Bettella | F04D 25/12 | 62/186 |
| 8,675,357 B2* | 3/2014 | Namek | H05K 7/20745 | 181/202 |
| 8,701,737 B2* | 4/2014 | Mainers | H05K 7/20745 | 160/1 |
| 8,727,843 B2* | 5/2014 | McReynolds | F24F 13/1426 | 454/184 |
| 8,744,631 B2* | 6/2014 | Wang | G05D 23/1932 | 165/67 |
| 8,873,235 B2* | 10/2014 | Chen | H05K 7/20836 | 361/694 |
| 8,882,572 B2* | 11/2014 | McReynolds | G05D 23/2716 | 137/343 |
| 8,914,155 B1* | 12/2014 | Shah | H05K 7/20836 | 700/19 |
| 9,055,695 B2* | 6/2015 | Mainers | H05K 7/20745 | |
| 2008/0266794 A1* | 10/2008 | Malone | H05K 7/20745 | 361/695 |
| 2010/0190430 A1* | 7/2010 | Rodriguez | H05K 7/20745 | 454/184 |
| 2010/0317278 A1* | 12/2010 | Novick | H05K 7/20836 | 454/184 |
| 2011/0244779 A1* | 10/2011 | Ohba | F24F 11/0001 | 454/184 |
| 2011/0256823 A1* | 10/2011 | Ludmann | H05K 7/20745 | 454/184 |
| 2011/0303406 A1* | 12/2011 | Takeda | H05K 7/20836 | 165/288 |
| 2012/0003912 A1* | 1/2012 | Hoover | H05K 7/20727 | 454/184 |
| 2012/0156981 A1* | 6/2012 | Curtin | H05K 7/20836 | 454/184 |
| 2015/0169797 A1* | 6/2015 | Marwah | G06F 1/206 | 703/6 |

* cited by examiner

CONTAINER DATA CENTER AND HEAT DISSIPATION SYSTEM

BACKGROUND

1. Technical Field

The present disclosure relates to container data centers, and particularly to a container data center comprising a heat dissipation system.

2. Description of Related Art

Container data centers generally include a container and a row of cabinet servers received in the container. Each cabinet server includes a number of severs generating a great amount of heat during operation. The heat needs to be dissipated timely to ensure the proper functioning of the container data center. Presently, the container comprises a raised floor for supporting the cabinet servers, the raised floor defines an air inlet connected to a condenser, and a number of air outlets adjacent to the server racks. Cool air enters the raised floor through the air inlet, and enters the container through the air outlets, cooling the cabinet servers. However, opening sizes of the air outlets cannot to be changed, thus, the airflow flowing through the air outlets of the raised floor cannot be adjusted.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
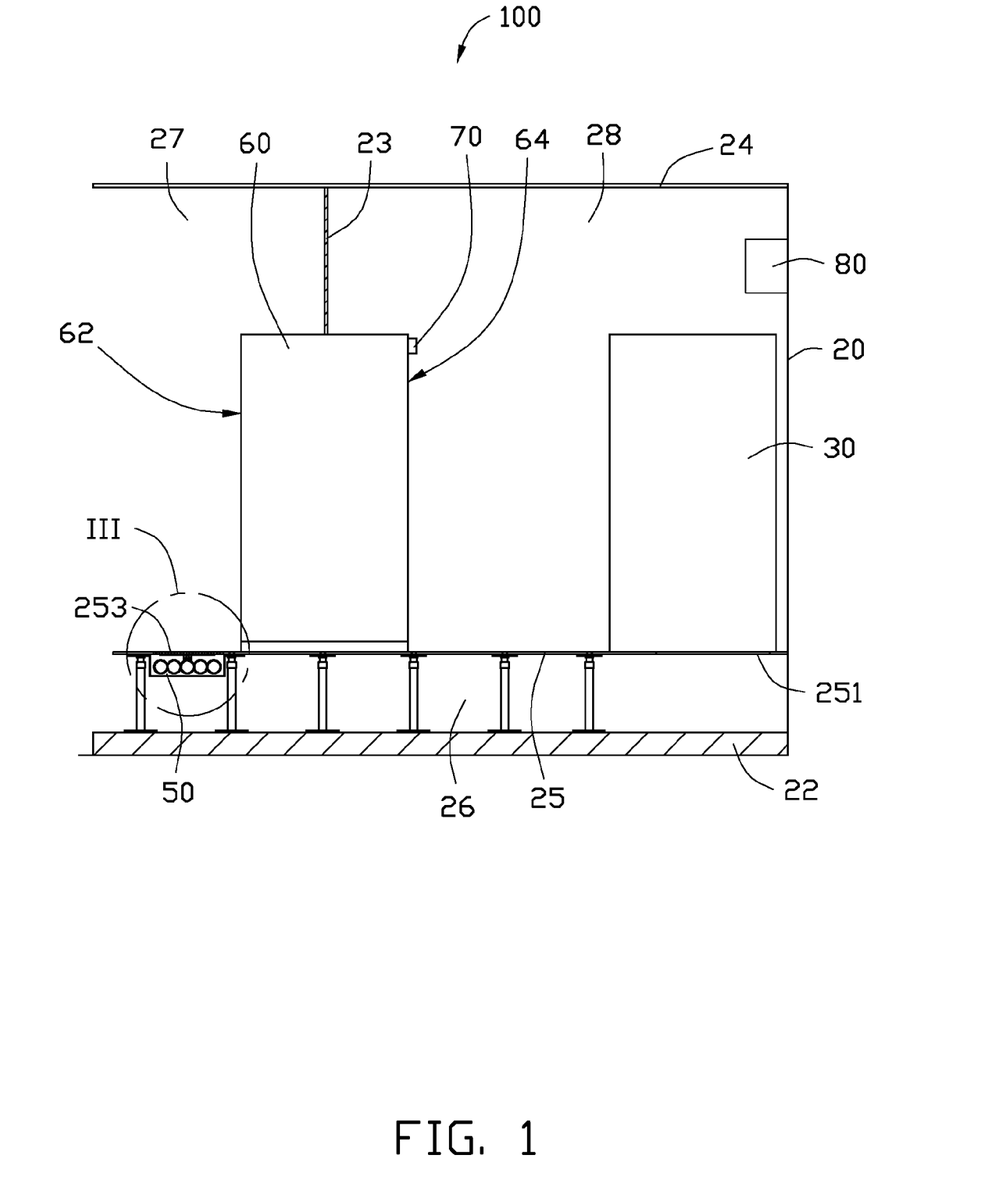
FIG. 1 is a cross-sectional view of an embodiment of a container data center, wherein the container data center comprises a plurality of airflow adjusting apparatus.

FIG. 1 shows an exemplary embodiment of a container data center 100. The container data center 100 comprises a container 20, a condenser 30, a plurality of airflow adjusting apparatus 50, a plurality of cabinet servers 60, and a controller 80 located in the container 20.

The container 20 comprises a bottom wall 22, a raised floor 25 located above the bottom wall 22, and a top wall 24. The bottom wall 22 and the raised floor 25 cooperatively bound an airflow channel 26. The cabinet servers 60 are supported on the raised floor 25, and arranged in one row. The condenser 30 is supported on the raised floor 25, and located at a first side of the cabinet servers 60. The raised floor 25 defines a plurality of air outlets 253 at a second side of the cabinet servers 60 away from the condenser 30. The air outlets 253 are arranged along the arrangement direction of the cabinet servers 60. The raised floor 25 defines an air inlet 251 communicating with the airflow channel 26, and the air inlet 251 is connected to an air outlet of the condenser 30 by a pipe.

A partition plate 23 is connected between the tops of the cabinet servers 60 and the top wall 24 of the container 20. A space of the container 20 is divided to a heat channel 28 located at the first side of the cabinet servers 60 and a cooling channel 27 located at the second side of the cabinet servers 60. The condenser 30 is received in the heat channel 20. The air outlets 253 communicate the cooling channel 27 to the airflow channel 26. An upper portion of the first side of each cabinet server 60 defines a plurality of air outlets 64 communicating with the heat channel 28, and the second side of each cabinet server 60 defines a plurality of air inlets 62 communicating with the cooling channel 27.

Figure 2:
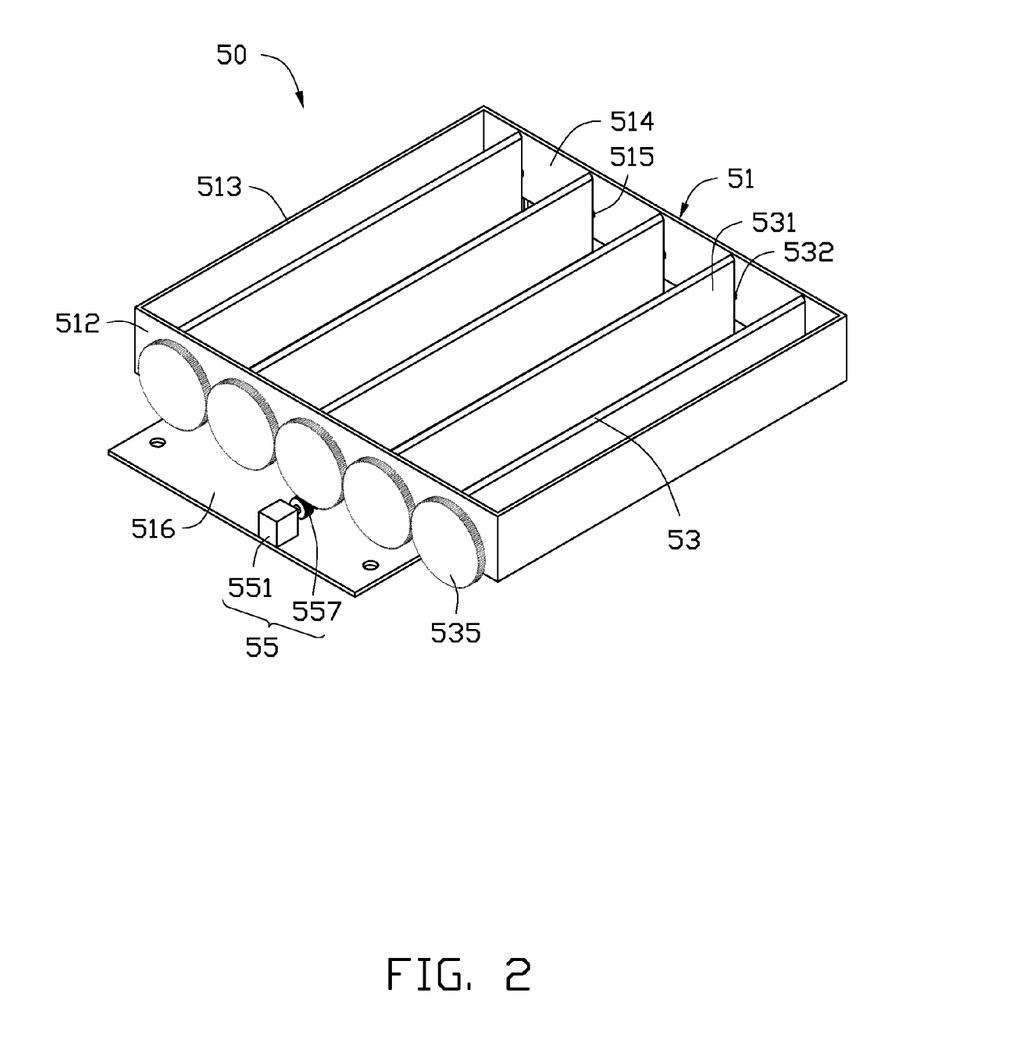
FIG. 2 is an isometric view of one of the airflow adjusting apparatus of FIG. 1.

FIG. 2 shows a first embodiment of each airflow adjusting apparatus 50 comprising a substantially rectangular bracket 51 mounted to a bottom surface of the raised floor 25 and aligning with the corresponding air outlets 253, a plurality of shielding members 53 rotatably received in the bracket 51, and a motor 55 for rotating the shielding members 53. The bracket 51 comprises two opposite end plates 512 and two opposite side plates 513 connected between the end plates 512. The end plates 512 and the side plates 513 cooperatively bound a through hole 514. The end plates 512 define a plurality pairs of shaft holes 515. The shaft holes 515 of each pair are in alignment with each other. A mounting plate 516 extends out from a bottom of one of the end plates 512. Each shielding member 53 comprises a substantially rectangular plate 531 received in the through hole 514, two opposite shafts 532 extending out from two opposite ends of the plate 531 and rotatably received in the corresponding shaft holes 515 of each pair, and a gear 535 fitted about one of the shafts 532. The shielding member 53 rotates along a direction parallel to the side plates 513. The gears 535 are located at the outside of the end plate 512 adjacent to the mounting plate 516, and are arranged in a row parallel to the end plate 512. Every two adjacent gears 535 mesh with each other. The motor 55 comprises a main body 551 mounted to the mounting plate 516 and a drive gear 557 meshing with one of the gears 535. The brackets 51 are arranged along the arrangement direction of the air outlets 253.

The main body 551 drives the drive gear 557 to rotate, and the drive gear 557 drives the gears 535 to rotate, thereby rotating the plates 531 to cover or uncover the through hole 514. Each motor 55 is electrically coupled to the controller 80.

Figure 4:
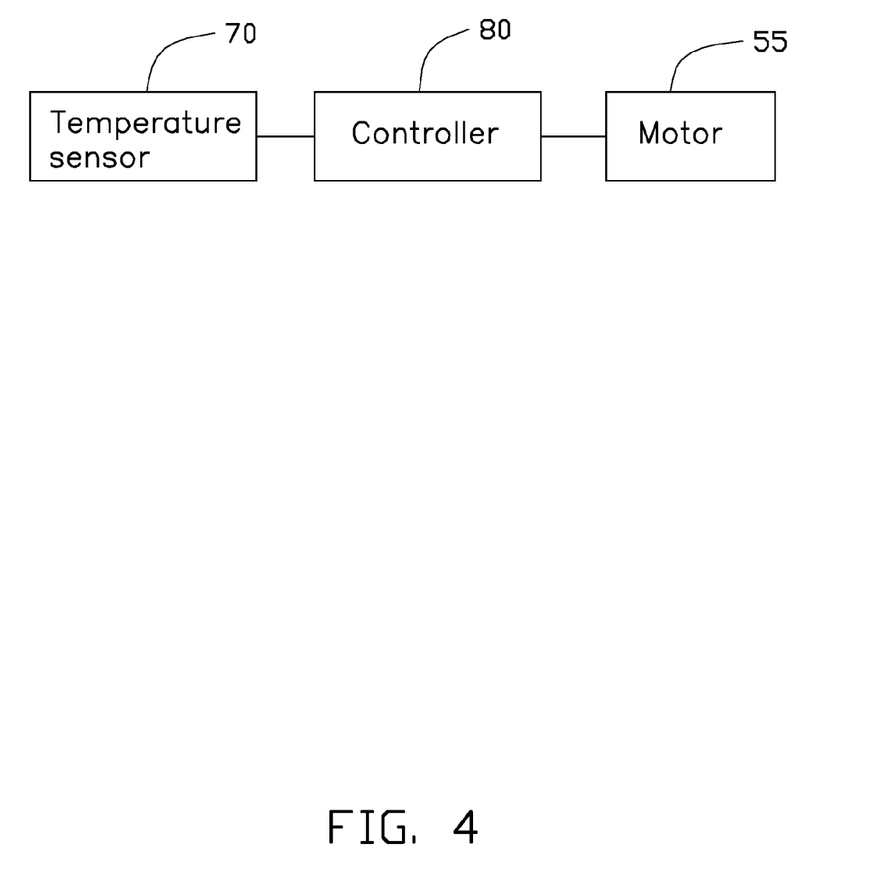
FIG. 4 is a block diagram of the container data center of FIG. 1.

A temperature sensor 70 is located at the upper portions of each of the cabinet servers 60, adjacent to the air outlets 64 of the cabinet servers 60. The temperature sensors 70 are electrically coupled to the controller 80.

Figure 3:
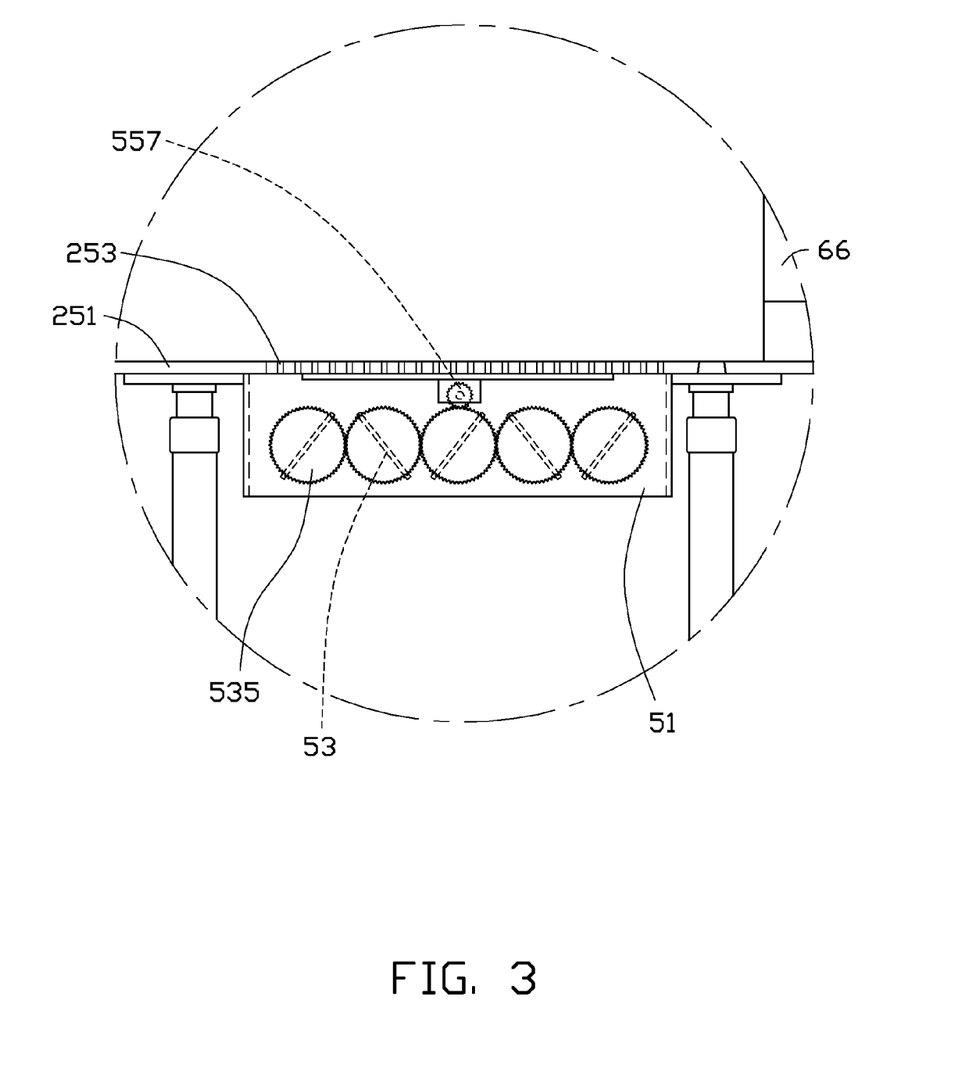
FIG. 3 is an enlarged view of the circled portion III of FIG. 1.
Figure 5:
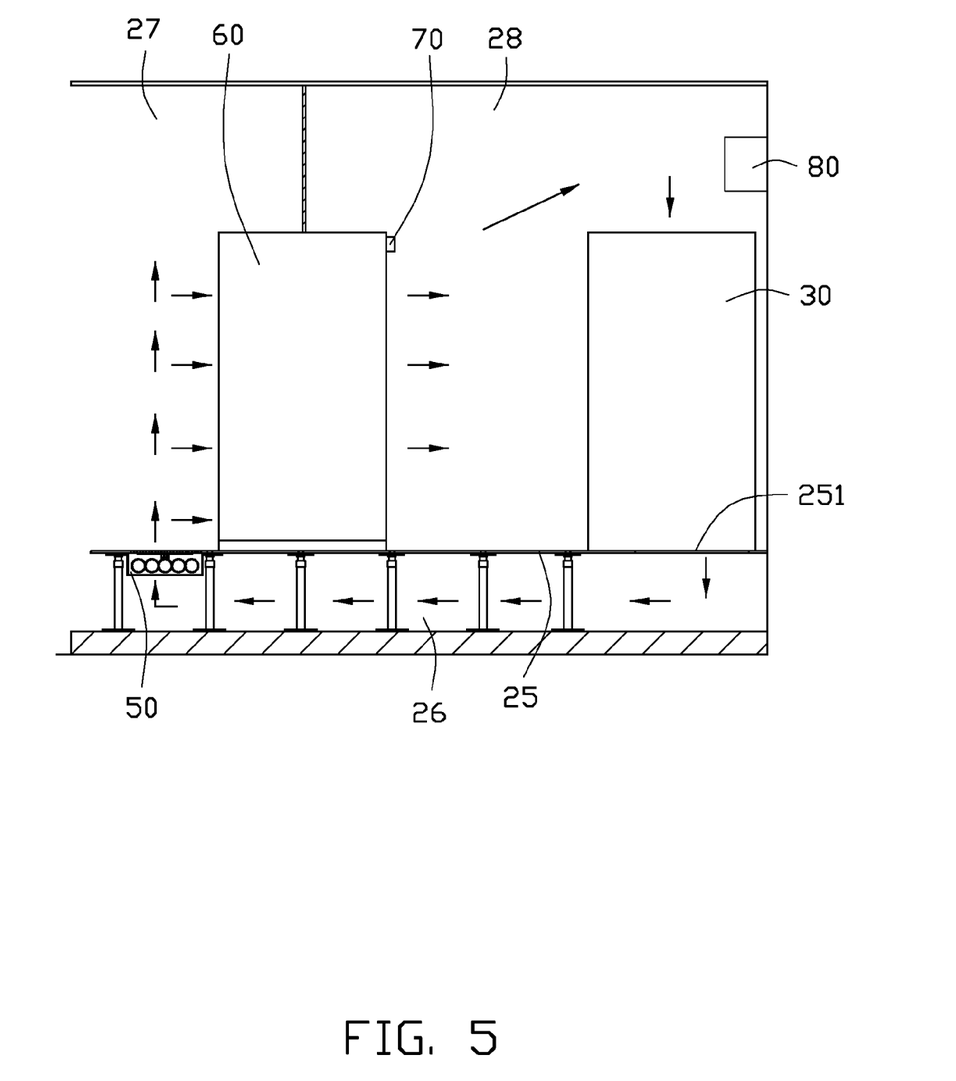
FIG. 5 is similar to FIG. 1, but showing the container data center in a state of use.

FIGS. 3-5 show that in use, the cabinet servers generate heat. The condensers 30 generate cool air flowing into the airflow channel 26 through the air inlet 251. The cool air enters the cooling channel 27 of the container 20 through the through holes 514 and the air outlets 253, and then enters the cabinet servers 60 through the air inlets 62 of the cabinet servers 60. The heat of the cabinet servers 60 is transferred to the cool air. Thus, the cool air is heated. The heated air flows into the heat channel 28 through the air outlets 64 of the cabinet servers 60. The temperature sensors 70 measure temperature of the air outlets 64 of the cabinet servers 60. Each temperature sensor 70 outputs a signal corresponding to the sensed temperature to the controller 80. The sensed temperatures are compared by the controller 80.

If the temperature of the air outlets 64 of one of the cabinet servers 60 is greater than the temperature of the air outlets 64 of the other cabinet servers 60, the controller 80 controls the motors 55 of the corresponding airflow adjusting apparatus 50 below the cabinet server 60 to operate to rotate the plates 531 to be parallel to the side plates 513, thereby increasing an opening size of the through holes 514 of the corresponding airflow adjusting apparatus 50, to increase airflow of the cool air flowing through the air outlets 253 corresponding to the airflow adjusting apparatus 50.

If the temperature of the air outlets 64 of one of the cabinet servers 60 is less than the temperatures of the air outlets 64 of the other cabinet servers 60, the controller 80 controls the motors 55 of the corresponding airflow adjusting apparatus 50 below the cabinet server 60 to operate to rotate the plates 531 of the corresponding airflow adjusting apparatus 50 to decrease an opening size of the through holes 514 of the corresponding airflow adjusting apparatus 50, to decrease airflow of the cool air flowing through the air outlets 253 corresponding to the airflow adjusting apparatus 50.

Figure 6:
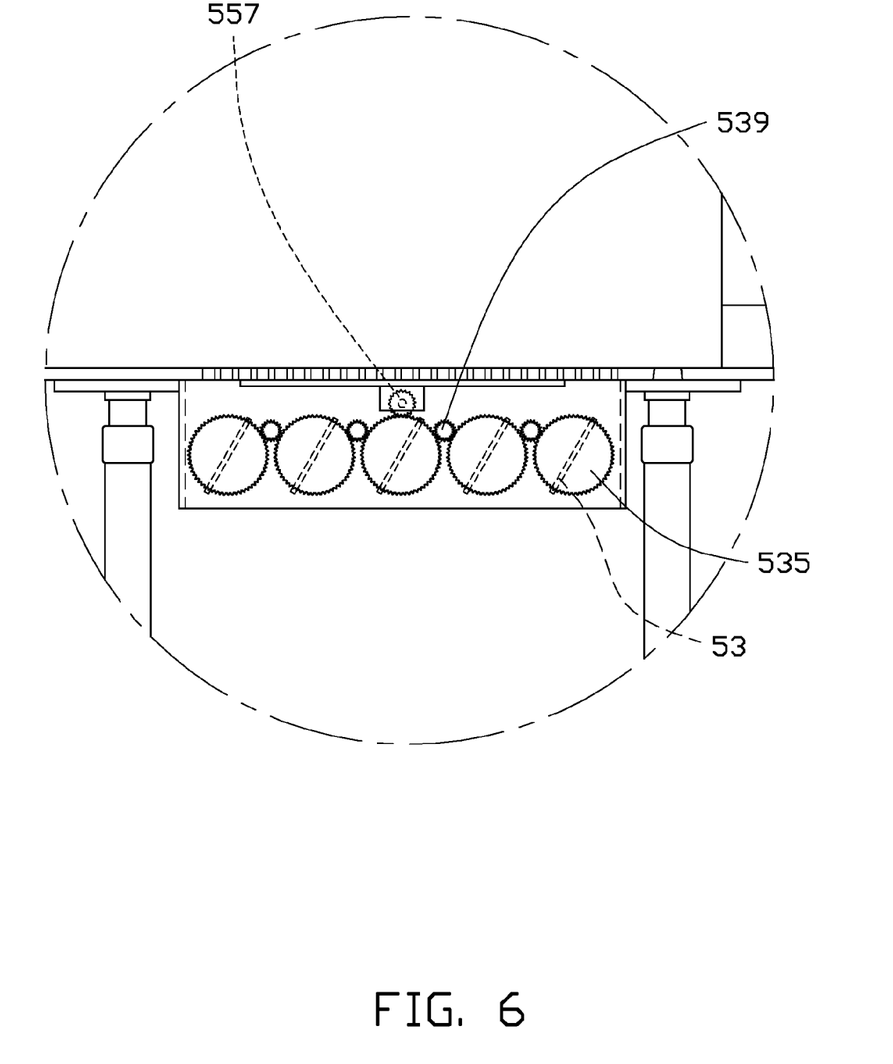
FIG. 6 is similar to FIG. 3, but showing a second embodiment of the airflow adjusting apparatus of the container data center.

FIG. 6 shows a second embodiment of the airflow adjusting apparatus 50 substantially similar to the first embodiment of the airflow adjusting apparatus 50. In the second embodiment, a space is defined between every two adjacent gears 535, and a connecting gear 539 is located in the space, and meshes with the two adjacent gears 535.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A heat dissipation system for dissipating heat for a plurality of cabinet servers supported on a raised floor defining a plurality of air outlets adjacent to each cabinet servers, comprising:
    a condenser;
    a controller;
    a plurality of airflow adjusting apparatus, wherein, in use, the plurality of airflow adjusting apparatus are mounted to the raised floor and aligning with the plurality of air outlets, each of the airflow adjusting apparatus comprises:
        a plurality of shielding members rotatable relative to the raised floor and aligning with a corresponding one of the air outlets;
        a bracket mounted to the raised floor, the bracket defines a through hole aligning with the corresponding one of the air outlets of the raised floor, the shielding members are rotatably installed to the bracket and received in the through hole; and
        a motor electrically coupled to the controller; and
    a temperature sensor located at an air exhaust of each of the cabinet servers, and electrically coupled to the controller;
    wherein, in use, the condenser generates cool air, the cool air firstly enters the raised floor, then passes through the plurality of air outlets of the raised floor and the plurality of airflow adjusting apparatus, and enters the cabinet servers, the controller controls the motor of each of the airflow adjusting apparatus to rotate the shielding members, to change an opening size of the plurality of air outlets of the raised floor, and
    wherein when a temperature of the temperature sensor of a respective one of the cabinet servers is greater than a temperature of the temperature sensor of each other of the cabinet servers, the controller controls the shielding members below the respective one of the cabinet servers to rotate, the opening size of the through hole of a corresponding one of the airflow adjusting apparatus adjacent to the respective one of the cabinet servers is increased, to allow an airflow of the cool air flowing through the corresponding one of the air outlets of the raised floor to increase.

2. The heat dissipation system of claim 1, wherein the bracket comprises two opposite end plates and two opposite side plates connected between the end plates, the end plates and the side plates cooperatively bound the through hole, the plurality of shielding members is rotatably installed between the end plates along a direction parallel to the side plates.

3. The heat dissipation system of claim 2, wherein the end plates define a plurality pairs of opposite shaft holes, each of the shielding members comprises a plate received in the through hole, two opposite shafts extending out from two ends of the plate and rotatably received in the shaft holes of a corresponding pair of the pairs of opposite shaft holes, and a gear fitted about one of the two opposite shafts, the gear of each of the plurality of shielding members is located outside a same one of the end plates, the gear and each adjacent gear mesh with each other, the motor comprises a drive gear meshing with only one gear of each of the airflow adjusting apparatus.

4. The heat dissipation system of claim 3, wherein the bracket comprises a mounting plate extends out from one of the end plates adjacent to the gear and each adjacent gear, the motor comprises a main body mounted to the mounting plate.

5. The heat dissipation system of claim 2, wherein the end plates define a plurality pair of opposite shaft holes, each of the shielding members comprises a plate received in the through hole, two opposite shafts extending out from two ends of the plate and rotatably received in the shaft holes of a corresponding pair of the pairs of opposite shaft holes, and a gear fitted about one of the two opposite shafts, the gear of each of the plurality of shielding members is located outside a same one of the end plates, the airflow adjusting apparatus further comprises a plurality of connecting gears each meshing with the gear and an adjacent gear, the motor comprises a drive gear meshing with one of the gear or the adjacent gear.

6. The heat dissipation system of claim 1, wherein when the temperature of the temperature sensor of a respective one of the cabinet servers is less than the temperature of the temperature sensor of each other of the cabinet servers, the controller controls the shielding members below the respective one of the cabinet server to rotate, the opening size of the through hole of the corresponding airflow adjusting apparatus is decreased, to allow the airflow of the cool air flowing through the corresponding one of the air outlets of the raised floor to decrease.

7. A container data center, comprising:
    a container comprising a bottom wall and a raised floor located above the bottom wall, the bottom wall and the raised floor cooperatively bound an airflow channel, wherein the raised floor defines an air inlet and a plurality of air outlets;
    a plurality of cabinet servers supported on the raised floor, and each of the cabinet servers adjacent to a corresponding one of the air outlets, each of the cabinet servers defining an air intake facing the corresponding one of the air outlets of the raised floor, and an air exhaust;
    a condenser supported on the raised floor, and connected to the air inlet;

a plurality of airflow adjusting apparatus mounted to the raised floor and each of the plurality of airflow adjusting apparatus aligning with the corresponding one of the air outlets, and comprising:
- a plurality of shielding members rotatable relative to the raised floor and aligning with the air outlet;
- a bracket mounted to a bottom surface of the raised floor, the bracket defines a through hole aligning with the corresponding one of the air outlets of the raised floor, the plurality of shielding members is rotatably installed to the bracket and received in the through hole; and
- a motor driving the plurality of shielding members to rotate;

a temperature sensor located at an air exhaust of each of the cabinet server; and a controller electrically coupled to the temperature sensor and the motor;

wherein the condenser generates cool air, the cool air firstly enters the airflow channel through the air inlet of the raised floor, then passes through the plurality of air outlets of the raised floor and the plurality of airflow adjusting apparatus, and enters the air intake of each of the cabinet servers, the controller controls the motor to rotate the plurality of shielding members, to change the opening size of the corresponding one of the air outlets of the raised floor, thereby adjusting airflow flowing through the air outlet of the raised floor, and wherein when a temperature of the temperature sensor of a respective one of the cabinet servers is greater than a temperature of the temperature sensor of each other of the cabinet servers, the controller controls the shielding members below the respective one of the cabinet servers to rotate, the opening size of the through hole of a corresponding one of the airflow adjusting apparatus adjacent to the respective one of the cabinet servers is increased, to allow an airflow of the cool air flowing through the corresponding one of the air outlets of the raised floor to increase.

8. The container data center of claim 7, further comprising a partition plate, wherein the container further comprises a top wall, the partition plate is connected between a top of the cabinet server and the top wall, to divide the container into a heat channel located at one side of the cabinet server and a cooling channel located at an opposite side of the cabinet server, the air inlet is communicated with the heat channel, the air outlet communicates the airflow channel to the cooling channel.

9. The container data center of claim 7, wherein the bracket comprises two opposite end plates and two opposite side plates connected between the end plates, the end plates and the side plates cooperatively bound the through hole, the plurality of shielding members is rotatably installed between the end plates along a direction parallel to the side plates.

10. The container data center of claim 9, wherein the end plates define a plurality pair of opposite shaft holes, each of the shielding members comprises a plate received in the through hole, two opposite shafts extending out from two ends of the plate and rotatably received in the shaft holes of a corresponding pair of the pairs of opposite shaft holes, and a gear fitted about one of the two opposite shafts, the gear of each of the plurality of shielding members is located outside a same one of the end plates, the gear and each adjacent gear mesh with each other, the motor comprises a drive gear meshing with only one gear of each of the airflow adjusting apparatus.

11. The container data center of claim 9, wherein the end plates define a plurality pair of opposite shaft holes, each of the shielding members comprises a plate received in the through hole, two opposite shafts extending out from two ends of the plate and rotatably received in the shaft holes of a corresponding pair of the pairs of opposite shaft holes, and a gear fitted about one of the two opposite shafts, the gear of each of the plurality of shielding members is located outside a same one of the end plates, the airflow adjusting apparatus further comprises a plurality of connecting gears each meshing with the gear and an adjacent gear to the gear, the motor comprises a drive gear meshing with one of the gear or the adjacent gear.

12. The heat dissipation system of claim 7, wherein when the temperature of the temperature sensor of a respective one of the cabinet servers is less than the a temperature of the temperature sensor of each other of the cabinet servers, the controller controls the shielding members below the respective one of the cabinet server to rotate, the opening size of the through hole of the corresponding airflow adjusting apparatus is decreased, to allow the airflow of the cool air flowing through the corresponding one of the air outlets of the raised floor to decrease.

13. A heat dissipation system for dissipating heat for a plurality of cabinet servers supported on a raised floor defining a plurality of air outlets adjacent to each cabinet servers, comprising:
- a condenser;
- a controller;
- a plurality of airflow adjusting apparatus, wherein, in use, the plurality of airflow adjusting apparatus are mounted to the raised floor and aligning with the plurality of air outlets, each of the airflow adjusting apparatus comprises:
  - a plurality of shielding members rotatable relative to the raised floor and aligning with a corresponding one of the air outlets;
  - a bracket mounted to the raised floor, the bracket defines a through hole aligning with the corresponding one of the air outlets of the raised floor, the shielding members are rotatably installed to the bracket and received in the through hole; and
  - a motor electrically coupled to the controller; and
- a temperature sensor located at an air exhaust of each of the cabinet servers, and electrically coupled to the controller;

wherein, in use, the condenser generates cool air, the cool air firstly enters the raised floor, then passes through the plurality of air outlets of the raised floor and the plurality of airflow adjusting apparatus, and enters the cabinet servers, the controller controls the motor of each of the airflow adjusting apparatus to rotate the shielding members, to change an opening size of the plurality of air outlets of the raised floor, and wherein when a temperature of the temperature sensor of a respective one of the cabinet servers is less than a temperature of the temperature sensor of each other of the cabinet servers, the controller controls the shielding members below the respective one of the cabinet server to rotate, the opening size of the through hole of the corresponding airflow adjusting apparatus is decreased, to allow the airflow of the cool air flowing through the corresponding one of the air outlets of the raised floor to decrease.

* * * * *